United States Patent [19]
Valbonesi

[11] 3,938,086
[45] Feb. 10, 1976

[54] CIRCUIT ARRANGEMENT FOR CORRECTING SLIP ERRORS IN PCM RECEIVERS

[75] Inventor: Giuseppe Valbonesi, Settimo Milanese, Italy

[73] Assignee: Societa Italiana Telecomunicazioni Siemens S.p.A., Milan, Italy

[22] Filed: Apr. 11, 1975

[21] Appl. No.: 567,062

[30] Foreign Application Priority Data
Apr. 11, 1974 Italy................................ 21252/74

[52] U.S. Cl........................................ 340/146.1 D
[51] Int. Cl.²........................................ H04L 7/00
[58] Field of Search.............. 340/146.1 D, 172.5; 178/69.5 R; 179/15 BS

[56] References Cited
UNITED STATES PATENTS

| | | | |
|---|---|---|---|
| 3,466,601 | 9/1969 | Tong | 340/146.1 D |
| 3,550,082 | 12/1970 | Tong | 340/146.1 D |
| 3,571,794 | 3/1971 | Tong | 340/146.1 D |
| 3,761,891 | 9/1973 | Markwitz | 340/146.1 D |
| 3,873,773 | 3/1975 | Guy, Jr. | 340/146.1 D |

*Primary Examiner*—Charles E. Atkinson
*Attorney, Agent, or Firm*—Karl F. Ross; Herbert Dubno

[57] ABSTRACT

A receiver of $n$-bit data words, each consisting of $k$ information bits and $(n-1)$ redundancy bits, comprises three error detectors receiving the incoming bit stream in parallel with one another and with a shift register of a transfer circuit, the three error detectors being triggered by timing pulses fed to them in staggered relationship from a clock circuit extracting synchronizing signals from the bit stream. In normal operation, the middle detector generates a recurrent no-error output signal which has no effect upon the cadence of the timing pulses. If either of the two other detectors emits such a no-error output signal in response to a forward or a backward slip by a predetermined number of bits $h$, the clock circuit is reset to compensate for the slip. The emission of an output signal from any error detector causes the readout of the received bits from the shift register in the transfer circuit.

5 Claims, 5 Drawing Figures

CIRCUIT ARRANGEMENT FOR CORRECTING SLIP ERRORS IN PCM RECEIVERS

FIELD OF THE INVENTION

My present invention relates to a circuit arrangement for correcting deviations from synchronization, referred to as slip errors, in a receiver of a pulse-code-modulation (PCM) system used, for example, in data transmission.

BACKGROUND OF THE INVENTION

In order to provide a check on the accuracy of an incoming code word and to facilitate the correction of errors, use is made in such data-transmission systems of binary code words of $n$-bits each which consist of a group of $k$ information bits supplemented by $(n-k)$ redundancy bits, all these bits constituting respective coefficients of a composite polynomial which normally is a multiple of a predetermined generator polynomial. The first $k$-bits, associated with the highest terms of the $(n-1)^{th}$—order polynomial, represent the information bits whereas the remaining $(n-k)$ bits serve as a check. If the word is correctly received, division of the generator polynomial into the composite polynomial results in an integral quotient, with zero remainder. A detector circuit can thus decide whether the received word is to be delivered to a load for which it is intended, such as a message decoder, or whether an error signal is to be generated.

Such detector circuits are well known per se. Reference in this connection may also be made to commonly owned U.S. application Ser. No. 536,992, filed Dec. 27, 1974 by Gustavo Pavoni et al.

If the detected error is merely the result of faulty synchronization, i.e. a simple slip in the timing of the incoming signals causing the bit count to commence before the end of a preceding word or after the beginning of a succeeding one, corrective measures can be taken at the receiving end without the need for transmission of an error signal to the originating station. Such corrective measures may comprise a compensatory shift neutralizing the slip error.

OBJECT OF THE INVENTION

The object of my present invention, therefore, is to provide a relatively simple circuit arrangement for discovering slip errors in a PCM receiver and promptly correcting such errors to re-establish proper synchronization.

SUMMARY OF THE INVENTION

I realize this object, in accordance with my present invention, by the provision of a plurality of error detectors connected to a transmission line carrying incoming code words with information and redundancy bits, as discussed above, these error detectors including transitory storage means for the incoming code words. The checking on the accuracy of a $n$-bit code word with the aid of its redundancy bits is carried out, in the usual manner, in response to timing pulses triggering each detector once per cycle, the trains of timing pulses fed to the several error detectors by a clock circuit being relatively staggered so that only one error detector — referred to hereinafter as the principal detector — emits an output signal during normal operation to indicate the presence of an error-free code word on its storage means. If a shift occurs, such an output signal is generated by another error detector and, through logical circuitry, is fed back to the clock circuit for resynchronizing same, thus re-establishing the principal detector as the generator of the output signal.

According to a more specific feature of my invention, the system includes two ancillary error detectors respectively receiving their timing pulses in leading and in lagging relationship with the timing pulses fed to the principal detector so as to be able to ascertain forward and backward slips, respectively.

According to a further feature of my invention, the several error detectors are connected to the line in parallel with a shift register also receiving the incoming code words, the contents of the shift register being read out to a load upon emission of an output signal by any error detector, under the control of a summing (OR or NOR) gate with input connections to these detectors. Thus, the readout occurs at precisely the time when the $n$-bits of a code word occupy the correct position within the shift register, regardless of a possible slip.

BRIEF DESCRIPTION OF THE DRAWING

The above and other features of my invention will now be described in detail with reference to the accompanying drawing in which.

SPECIFIC DESCRIPTION

Figure 1:
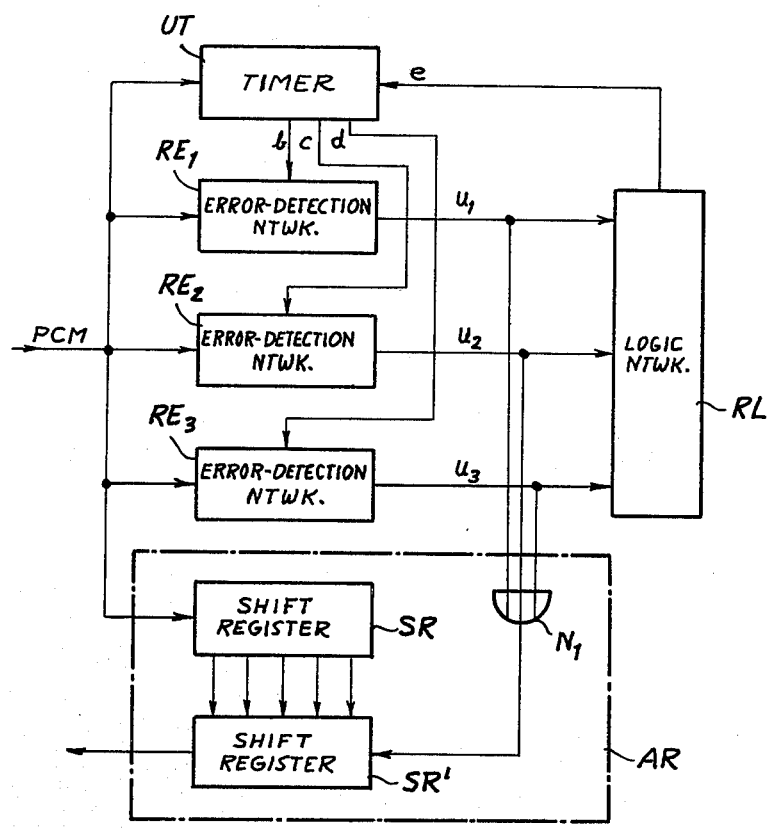
FIG. 1 is a block diagram of a circuit arrangement for correcting slip errors in accordance with my invention.

In FIG. 1 I have shown a transmission line L carrying incoming PCM signals. These signals are applied in parallel to the inputs of three error-detecting networks $RE_1$-$RE_3$, an associated timer UT, and a shift register SR forming part of a transfer circuit AR. This transfer circuit also includes a further shift register SR', with $n$ stages directly connected to corresponding stages of register SR for parallel readout, and an OR gate $N_1$ connected to the outputs of error detectors $RE_1$-$RE_3$ in order to cause the transfer of the contents of the $n$ significant stages of register SR to register SR' in response to an output signal $u_1$, $u_2$ or $u_3$ from any of these detectors. The same output signal also reaches a logic network RL adapted to feed back a resynchronization signal $e$ to timer UT as more fully described hereinafter.

The principal error detector $RE_2$ receives timing pulses $c$ from component UT, these pulses being synchronized with the incoming code words during normal operation so that this detector will periodically emit its output signal $u_2$ if no slip or other error occurs. Similar timing pulses $b$ and $d$ are applied to ancillary detector $RE_1$, in leading relationship with pulses $c$, and to ancillary detector $RE_3$, in lagging relationship therewith, respectively. Thus, if a temporary malfunction causes the loss of a certain number $h$ of bits in transmission so that an incoming word is advanced by that many bit positions with reference to its normal time position as determined by the pulses $c$, detector $RE_1$ will note the presence of an error-free code word and will generate an output signal $u_1$; conversely, a delay in the relative time position through the accidental acquisition of a like number $h$ of supernumerary bits will elicit a response from error detector $RE_3$ with corresponding emission of an output signal $u_3$. Since the occurrence of signal $u_1$ or $u_3$ will coincide with the proper positioning of the advanced or delayed word in shift register SR, a transfer of its $n$ bits to the associated register SR' with subsequent serial readout of these bits to a nonillustrated load can take place under the control of OR gate $N_1$.

Under these circumstances, the resynchronization signal $e$ appearing in the output of logic network RL resets the timer UT so as to advance or delay the timing of the pulse trains $b$, $c$ and $d$ by $h$ time positions whereby the next code word, in the absence of any further slip, will be properly recognized by the principal detector $RE_2$ with resulting restoration of the normal mode of operation.

Figure 2A:
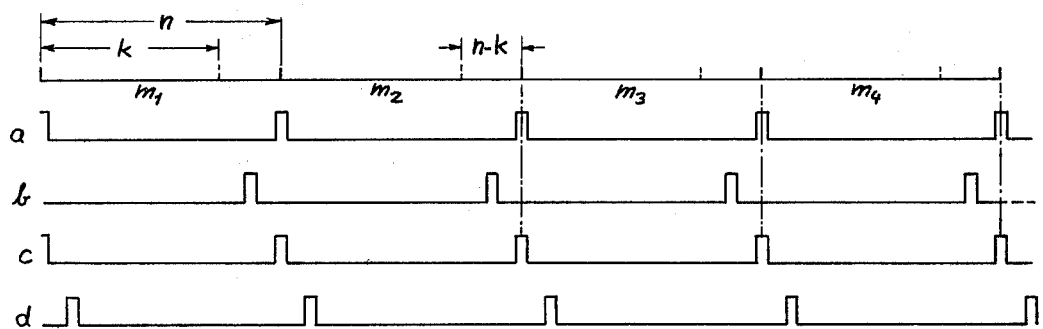
FIGS. 2A, 2B and 2C are three sets of graphs serving to explain the operation of the system of FIG. 1.

This normal mode has been illustrated by the graphs of FIG. 2A showing a succession of code words $m_1$–$m_4$ of identical length, each consisting of $n$ bits including $k$ information bits and $(n-k)$ redundancy bits. Timer UT (FIG. 1) derives from this bit stream, in the conventional manner, a train of synchronization pulses $a$ coinciding with the pulse train $c$ delivered to principal detector $RE_2$. Pulse trains $b$ and $d$, having the same cadence as pulse train $c$, are respectively advanced and delayed with reference thereto by $h$ bits (cf. FIG. 2B).

Figure 2B:
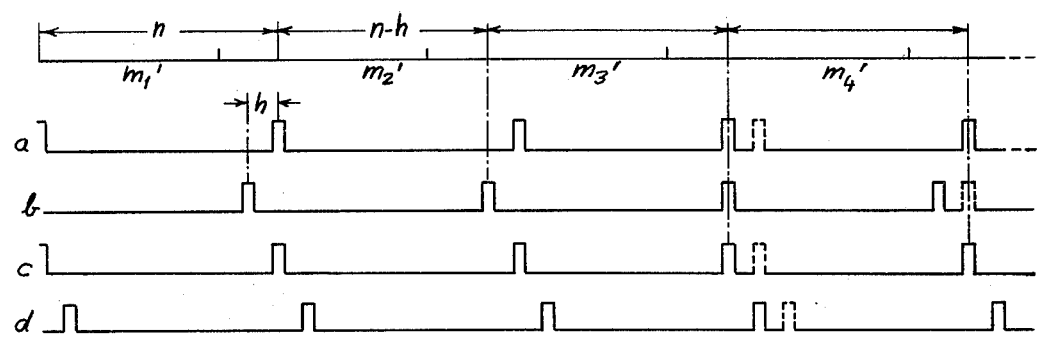

FIG. 2B illustrates the situation where, in a succession of incoming code words $m_1'$–$m_4'$, a loss of $h$ bits occurs in the second word $m_2'$ which therefore numbers only $(n-h)$ bits. At the time of occurrence of a timing pulse $b$, error detector $RE_1$ contains all the $(n-1)$ bits of the foreshortened word $m_2'$ along with $h$ bits of the preceding word $m_1'$; this will generally not provide the necessary correlation between information and redundancy bits to yield an output signal $u_1$. Such correlation will also be absent in error detectors $RE_2$ and $RE_3$ both containing bits of the next code word $m_3'$ at the instant of triggering by pulses $c$ and $d$, respectively. Thus, OR gate $N_1$ in FIG. 1 remains closed and the multilated word $m_2'$ is not read out.

In the next cycle, the full code word $m_3'$ properly registers with a timing pulse $b$ so that error detector $RE_1$ emits an output signal $u_1$. That signal, besides authorizing the readout of word $m_3'$, also gives rise to a resynchronization signal $e$ which resets the pulse trains $a$, $b$, $c$ and $d$, from the dotted-line to the solid-line positions, in the next cycle whereby the following word $m_4'$ again properly registers with a pulse $c$ and produces a signal $u_2$ in the output of error detector $RE_2$.

Figure 2C:
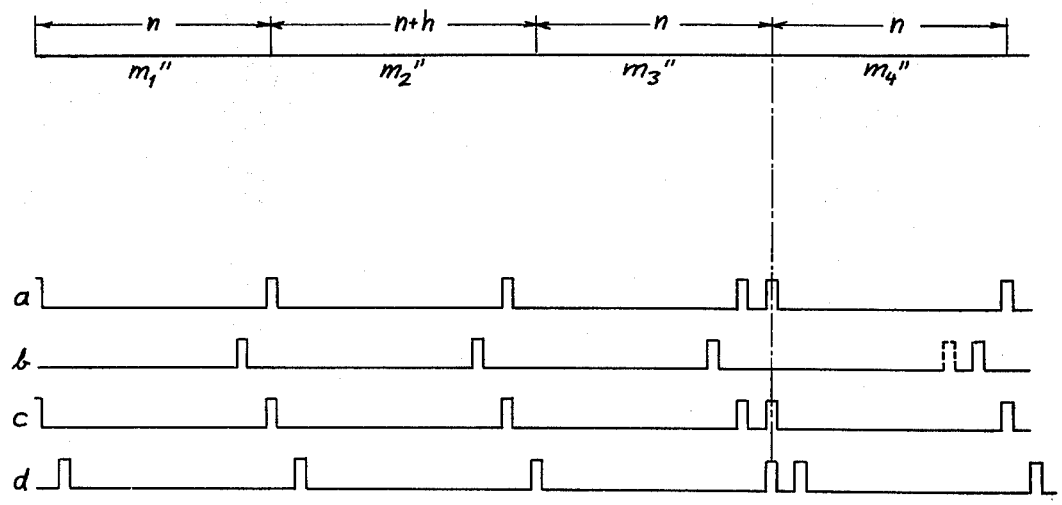

In FIG. 2C, illustrating a further series of incoming code words $m_1''$–$m_4''$, the second word $m_2''$ has been lengthened to a bit count of $(n+h)$ through the acquisition of $h$ supernumerary bits. In that cycle, error detector $RE_1$ will have no output because of the presence of bits of the preceding word $m_1''$ whereas detectors $RE_2$ and $RE_3$ will sense a lack of correlation in the presence of an incomplete code word. Again, therefore, no transfer between shift registers SR and SR' will take place. In the next cycle, however, word $m_3''$ registers properly with pulse train $d$ so that detector $RE_3$ emits an output signal $u_3$, authorizing the readout. This same output signal gives rise to a resynchronization signal $e$ which now realigns the pulse trains $a$–$d$ with the shifted word sequence, in the next cycle, by the duplication of pulses $c$, $d$ and by a delay of pulse $b$ as indicated in dotted and solid lines. Word $m_4''$, accordingly, will be properly recognized by detector $RE_2$ with restoration of the normal mode of operation.

Figure 3:
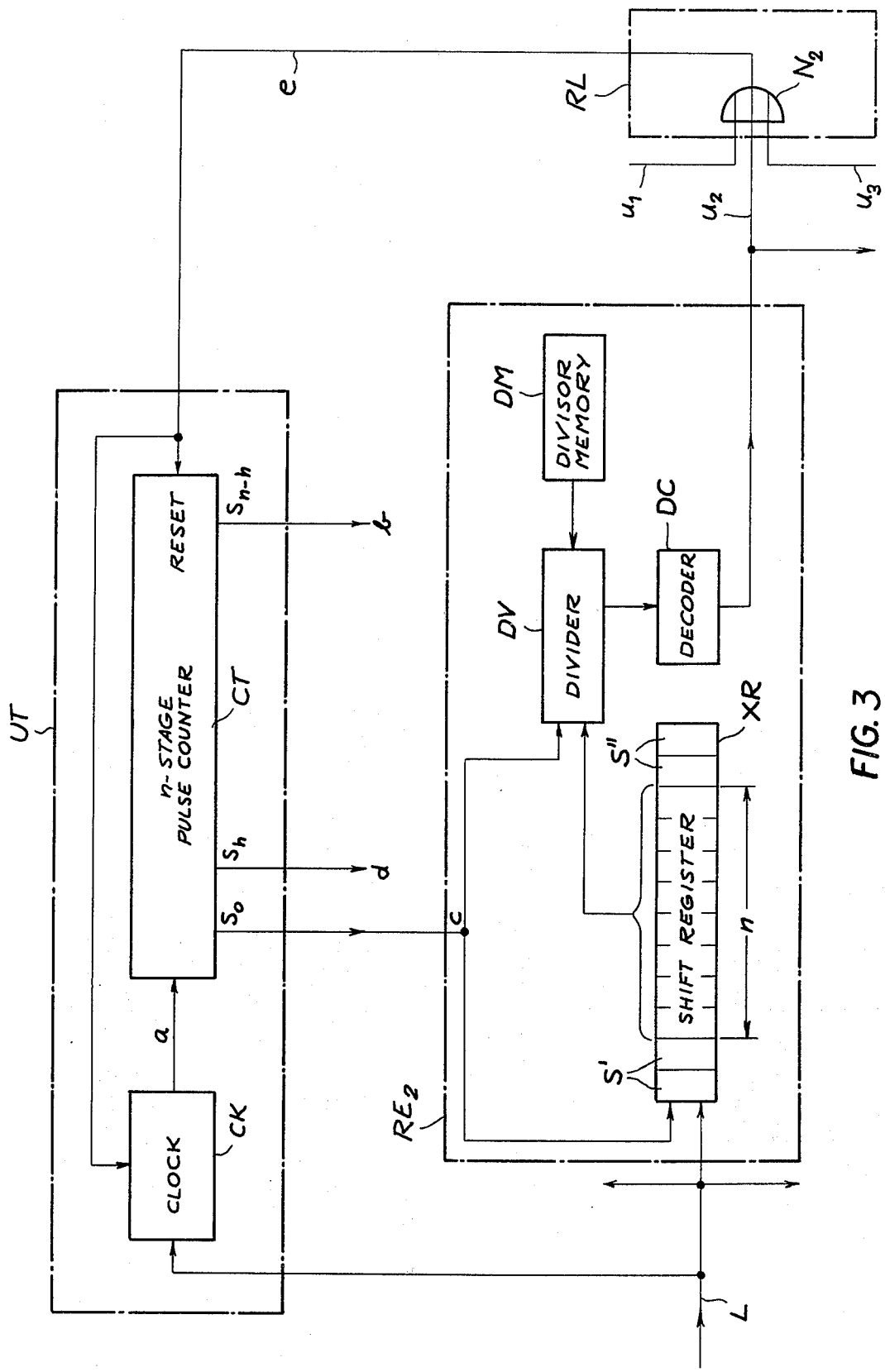
FIG. 3 is a more detailed circuit diagram of various components shown in block form in FIG. 1.

In FIG. 3 I have shown, by way of example, details of components UT, RL and $RE_2$, the latter being of course also representative of error detectors $RE_1$ and $RE_3$. Timer UT comprises a clock circuit CK which extracts the synchronization pulses $a$ from the bit stream arriving over line L and feeds them to an $n$-stage pulse counter CT. Leading pulses $b$, normal pulses $c$ and lagging pulses $d$ are obtained from stages $s_{n-h}$, $s_0$ and $s_h$, respectively, of counter CT; if $h = 1$, stage $s_{n-h}$ is the last stage of the counter. The timing pulses delivered to error detector $RE_2$ from counter CT, specifically from its stage $s_0$, are applied on the one hand to a shift register XR and on the other hand to a binary divider DV. A generator polynomial, stored in a divisor memory DM, is fed to divider DV along with a group of $n$ bits stored in a central section of register XR at the instant of arrival of pulse $c$. With proper synchronization, a weighted polynomial derived from these $n$ bits is an exact multiple of the generator polynomial stored in memory DM so that the remainder of the arithmetical operation performed in divider DV is zero, this remainder being delivered to a decoder DC whose output is the signal $u_2$ in the presence of such a zero remainder.

As described in the commonly owned application Ser. No. 536,992 identified above, register XR may include one or more supplemental stages S', S'' at its input and output ends to permit discrimination between different kinds of errors; the contents of these supplemental stages are not taken into consideration by the divider DV.

Logic network RL is here shown to comprise simply an OR gate $N_2$ generating the resynchronization signal $e$ in its output whenever one of the signals $u_1$, $u_2$, $u_3$ appears in its input. Signal $e$ resets the counter CT and also readjusts the clock circuit CK. Since the counter is already reset at the time a pulse $c$ is emitted by its stage $s_0$, a signal $e$ resulting from a signal $u_2$ does not cause any change in timing. On the other hand, a resetting in response to a signal $u_1$ advances the counter from stage $s_{n-h}$ to stage $s_0$ whereas a resetting in response to a signal $u_3$ restarts the count as indicated by the duplication of pulses in FIG. 2C.

If $h$ is an integer greater than 1, pulses $c$ could also be obtained from the final stage or stages beyond stage $s_{n-h}$ and from all the initial stages preceding stage $s_h$, thus allowing for the occurrence of limited shifts without a resetting of the timer. The number of counter stages alternatively emitting signals $b$ and $d$ could be similarly increased.

I claim:

1. In a receiver for binary code words including information bits and redundancy bits to enable detection of an error, in combination:
   a line carrying incoming code words;
   a plurality of error detectors including a principal detector connected to said line in parallel with one another and provided with transitory storage means for said code words;
   clock means connected to said line for generating a plurality of relatively staggered trains of timing pulses respectively delivered to said error detectors for triggering same into emitting an output signal in the presence of an error-free code word on said storage means thereof, only said principal detector emitting such an output signal upon proper synchronization of said clock means with said incoming code words; and
   logical circuitry connecting said error detectors to said clock means for resynchronizing same in response to an output signal from an error detector other than said principal detector.

2. The combination defined in claim 1 wherein said error detectors include two ancillary detectors respectively receiving said timing pulses in leading relationship and in lagging relationship with the timing pulses fed to said principal detector for ascertaining forward and backward slips.

3. The combination defined in claim 1, further comprising register means connected to said line in parallel with said error detectors for receiving said code words, said error detectors being connected to said register means for reading out the contents thereof to a load upon emission of an output signal by any error detector.

4. The combination defined in claim 3 wherein said register means comprises a first shift register connected to said line for serially receiving the bits of successive words and a second shift register connected to said first shift register for parallel transfer of said bits between respective stages thereof in response to said output signal.

5. The combination defined in claim 3 wherein said register means is provided with a control circuit including a summing gate with input connections to all said error detectors for receiving the output signals thereof.

* * * * *